United States Patent
Tu et al.

(10) Patent No.: US 11,698,875 B2
(45) Date of Patent: Jul. 11, 2023

(54) IC, MONITORING SYSTEM AND MONITORING METHOD THEREOF

(71) Applicant: Nuvoton Technology Corporation, Hsinchu Science Park (TW)

(72) Inventors: Chieh-Sheng Tu, Hsinchu (TW); Ta-Chin Chiu, Hsinchu Science Park (TW)

(73) Assignee: NUVOTON TECHNOLOGY CORPORATION, Hsinchu Science Park (TW)

(*) Notice: Subject to any disclaimer, the term of this patent is extended or adjusted under 35 U.S.C. 154(b) by 0 days.

(21) Appl. No.: 17/510,906

(22) Filed: Oct. 26, 2021

(65) Prior Publication Data
US 2022/0374373 A1    Nov. 24, 2022

(30) Foreign Application Priority Data

May 18, 2021   (TW) ................ 110117833

(51) Int. Cl.
*G06F 13/28*   (2006.01)
*G06F 30/33*   (2020.01)
*G06F 30/337*  (2020.01)

(52) U.S. Cl.
CPC .............. *G06F 13/28* (2013.01); *G06F 30/33* (2020.01); *G06F 30/337* (2020.01); *G06F 2213/0016* (2013.01)

(58) Field of Classification Search
CPC ........ G06F 13/28; G06F 30/33; G06F 30/337; G06F 2213/0016
See application file for complete search history.

(56) References Cited

U.S. PATENT DOCUMENTS

| | | | | |
|---|---|---|---|---|
| 6,671,520 B1* | 12/2003 | Kim | ................. | H04L 67/04 348/211.6 |
| 2009/0204383 A1* | 8/2009 | Weiss | ................. | G06F 11/261 703/28 |
| 2012/0155603 A1* | 6/2012 | Mackenna | ............ | H03K 21/38 377/27 |

FOREIGN PATENT DOCUMENTS

| | | |
|---|---|---|
| CN | 1661580 A | 8/2005 |
| CN | 104769569 A | 7/2015 |

(Continued)

OTHER PUBLICATIONS

Office Action of TW Application No. 110117833, dated Dec. 10, 2021, 6 pages.

(Continued)

*Primary Examiner* — Idriss N Alrobaye
*Assistant Examiner* — Ronald T Modo
(74) *Attorney, Agent, or Firm* — Muncy, Geissler, Olds & Lowe, P.C.

(57) ABSTRACT

An IC is provided. The IC includes an input pin, a controller, a timer, a first memory, a processor, at least one output pin, an output module coupled to the output pin, and a direct memory access (DMA) device coupled between the output module and the first memory. The controller is configured to provide a first control signal in response to a command from the input pin. The timer is configured to periodically provide a trigger signal according to the first control signal. The processor is configured to store first data in the first memory. The DMA device is configured to obtain the first data from the first memory in response to the trigger signal, and transmit the first data to the output module. The output module is configured to provide the first data to the output pin according to a transmission rate.

20 Claims, 3 Drawing Sheets

(56) References Cited

FOREIGN PATENT DOCUMENTS

| | | | |
|---|---|---|---|
| CN | 105607863 A | 5/2016 | |
| CN | 109240954 A | 1/2019 | |
| TW | 201342214 A | 10/2013 | |
| WO | WO-2017183483 A1 * | 10/2017 | ......... G06F 13/4282 |

OTHER PUBLICATIONS

NUVOTON, "NuMaker-M471KI User Manual NuMicro® M471 Series" Figs. 3 & 5 on p. 33, Nov. 4, 2020, 47 pages.

* cited by examiner

IC, MONITORING SYSTEM AND MONITORING METHOD THEREOF

CROSS REFERENCE TO RELATED APPLICATIONS

This application claims priority of Taiwan Patent Application No. 110117833, filed on May 18, 2021, the entirety of which is incorporated by reference herein.

BACKGROUND OF THE INVENTION

Field of the Invention

The invention relates to a monitoring system, and more particularly to a monitoring system for monitoring memories of an integrated circuit (IC).

Description of the Related Art

Microcontroller units (MCUs) or microprocessors are widely used in various industrial and household electrical products or equipment. At present, the program development of the MCU/microprocessor must use a chip simulation system, and it must also use breakpoints to monitor the execution status of the program so as to debug the program.

BRIEF SUMMARY OF THE INVENTION

An IC, a monitoring system, and a monitoring method thereof are provided. An embodiment of an IC is provided. The IC includes at least one input pin, a controller coupled to the input pin, a timer, a first memory, a processor coupled to the first memory, at least one output pin, an output module coupled to the output pin, and a direct memory access (DMA) device coupled between the output module and the first memory. The controller is configured to provide a first control signal in response to a command from the input pin. The timer is configured to periodically provide a trigger signal according to the first control signal. The processor is configured to store first data in the first memory. The DMA device is configured to obtain the first data from the first memory in response to the trigger signal, and transmit the first data to the output module. The output module is configured to provide the first data to the output pin according to a transmission rate.

Moreover, an embodiment of a monitoring system is provided. The monitoring system includes a bridge and an integrated circuit (IC). The IC includes at least one input pin coupled to the bridge, a controller directly coupled to the input pin, a timer, a first memory, at least one first output pin, a first output module coupled to the first output pin, and a direct memory access (DMA) device coupled to the first output module and the first memory. The input pin is configured to receive a command from the bridge. The controller is configured to provide a first control signal in response to the command. The timer is configured to periodically provide a trigger signal according to the first control signal. The DMA device is configured to obtain first data from the first memory in response to the trigger signal, and transmit the first data to the first output module. The first output module is configured to provide the first data to the first output pin according to the first transmission rate.

Furthermore, an embodiment of a monitoring method for a memory of an integrated circuit (IC) is provided. A command from a bridge is obtained when the bridge is connected to the IC. The first transmission rate of the first output module of the IC is set according to the command. The timer of the IC is set according to the command, so as to periodically provide a trigger signal. In response to the trigger signal, first data from the first memory is obtained through a direct memory access (DMA) device of the IC. The first data is provided to the outside of the IC through the first output module according to the first transmission rate.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

For debugging a microcontroller/microprocessor, an in-circuit emulator (ICE) is used. The microcontroller/microprocessor under test can be implemented in an integrated circuit (IC) of a printed circuit board (PCB), and the ICE is coupled between the PCB and a processing apparatus. The processing apparatus may be a computer or an electronic device, such as a personal computer, a tablet computer or a mobile phone, and the processing apparatus is provided with an integrated development environment (IDE). Therefore, an engineer can simulate the actions of the microcontroller/microprocessor through the IDE, so as to shorten the development time and debugging time for a program.

Figure 1:
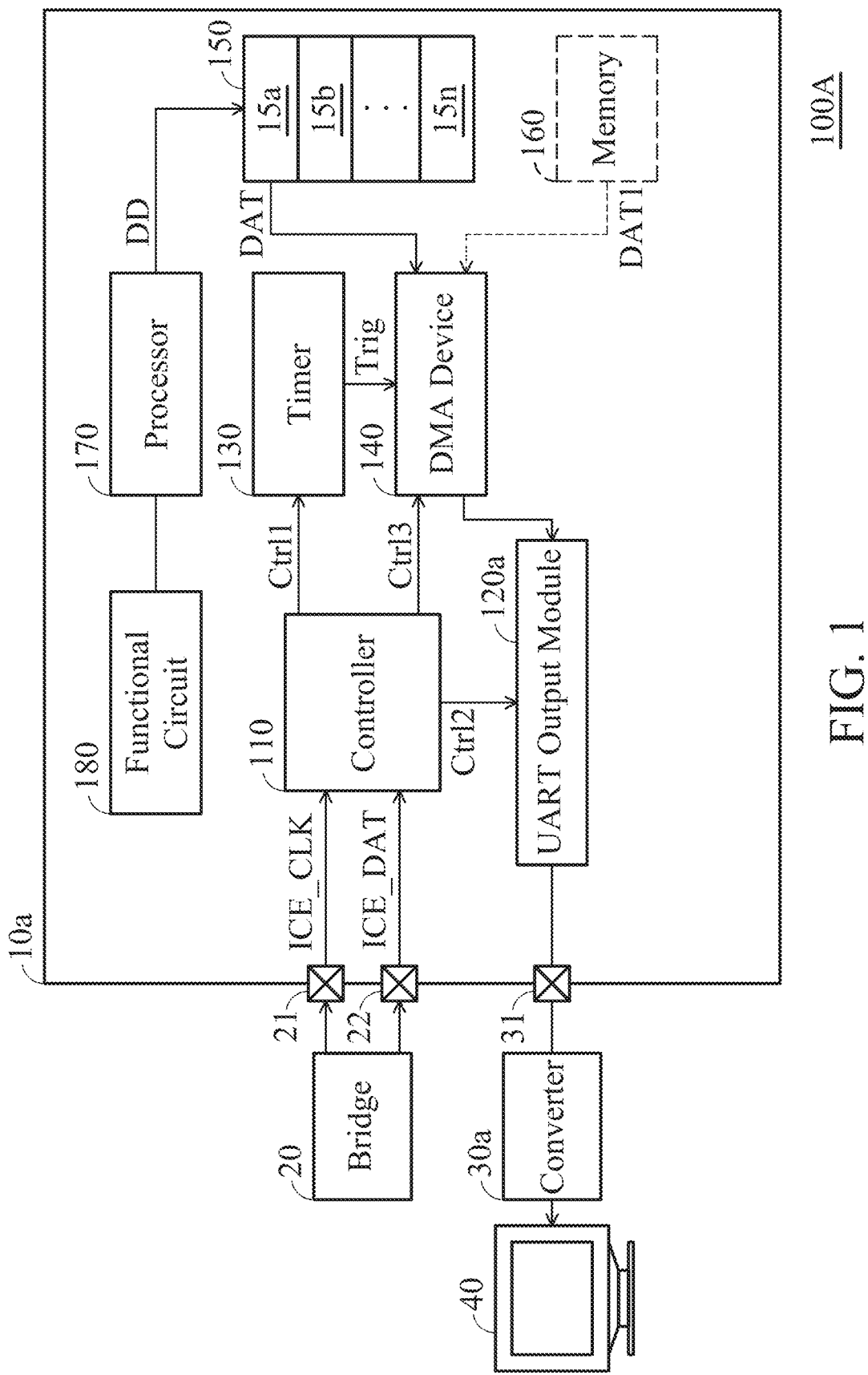
FIG. 1 shows a monitoring system of memory contents according to some embodiments of the invention.

FIG. 1 shows a monitoring system 100A of memory contents according to some embodiments of the invention. The monitoring system 100A includes an IC 10a, a bridge 20, a converter 30a, and a display 40. In some embodiments, the IC 10a is a chip under test which is disposed on the PCB and has a plurality of pins. In some embodiments, the IC 10a may be a microcontroller or a microprocessor. In some embodiments, the display 40 may be a personal computer with integrated development system software (IDE). The bridge 20 may be an emulator used in an integrated development system software environment, such as ULink, J-Link, or Nu-Link. In some embodiments, by using the integrated development system software, the bridge 20 can access the registers and memory in the IC 10a, and control the controller 110 in the IC 10a to perform different programs and obtain the execution result. At the same time, under the integrated development system software environment, the user can diagnose the operation status of the IC 10a through the bridge 20. In some embodiments, the operation of the bridge 20 is set by a personal computer (such as the display 40) with integrated development system software. In some embodiments, the bridge 20 has a storage, and the bridge 20 is configured to perform the corresponding operations according to the debugging mode or program stored in the storage.

The IC 10a includes a controller 110, an output module 120a, a timer 130, a direct memory access (DMA) device 140, a memory 150, a processor 170, and a functional circuit 180. In this embodiment, the DMA device 140 may be a peripheral direct memory access (PDMA). The controller 110 is coupled to the bridge 20 through the pin 21 and the pin 22. The pin 21 and the pin 22 are input pins, and the controller 110 is directly coupled to the pin 21 and the pin 22. In the IC 10a, the pin 21 is configured to receive the clock signal ICE_CLK from the bridge 20, and the pin 22 is configured to receive the command ICE_DAT from the bridge 20. In some embodiments, the IC 10a is configured to receive the command ICE_DAT from the bridge 20 through multiple pins. The controller 110 is coupled to the output module 120a, the timer 130 and the DMA device 140. According to the command ICE_DAT from the bridge 20, the controller 110 is configured to provide the control signals Ctrl1, Ctrl2, and Ctrl3 to the timer 130, the output module 120a, and the DMA device 140, respectively. In this embodiment, the output module 120a is a universal asynchronous receiver/transmitter (UART) output module, hereinafter referred to as the UART output module 120a. The UART output module 120a is coupled to the converter 30a through the pin 31. In this embodiment, the converter 30a is a universal serial bus to a universal asynchronous receiver transmitter (USB-to-UART) connector, and configured to convert the UART signal from the pin 31 into the USB signal and transmit the USB signal to the display 40. In some embodiments, the display 40 may be a processing device such as a personal computer, a tablet, or a mobile phone.

In this embodiment of the invention, the DMA device 140 can be used for data transmission. In addition, the DMA device 140 may transfer data from one device (or address) to another device (or address) without using the processor 170 (or controller). Therefore, the workload of the processor 170 is reduced, so that the processor 170 can execute other application programs. In some embodiments, the DMA device 140 can set the transmission channel to transmit data between the memory and the device or between different memories. In some embodiments, the processor 170 may be a central processing unit (CPU). In some embodiments, the functional circuit 180 may perform a specific function. For example, the functional circuit 180 may be the controller of a peripheral device, converter, receiver, transmitter, or transceiver.

In FIG. 1, according to the control signal Ctrl1 from the controller 110, the timer 130 is configured to periodically provide a trigger signal Trig to the DMA device 140. In some embodiments, the timer 130 may be implemented in the controller 110, and the controller 110 is configured to periodically provide the trigger signal Trig to the DMA device 140. Moreover, according to the control signal Ctrl3 from the controller 110, the DMA device 140 is configured to set the transmission channel so as to access the memory 150 in response to the trigger signal Trig to obtain the data DAT. Next, after obtaining the data DAT, the DMA device 140 is configured to transmit the data DAT to the UART output module 120a. The memory 150 includes a plurality of blocks 15a-15n. In some embodiments, the block accessed by the DMA device 140 is determined by the control signal Ctrl3, that is, the transmission channel. Furthermore, according to the control signal Ctrl2 from the controller 110, the UART output module 120a is configured to transmit the data DAT to the converter 30a through the pin 31 according to the UART communication protocol. In this embodiment, the UART output module 120a is configured to set the transmission rate of the data DAT according to the control signal Ctrl2. Thus, the data DAT is transferred to the display 40 through the converter 30a for the user to monitor the memory 150 in real time. Therefore, in some embodiments, the user can simultaneously use the bridge 20 to debug the IC 10a and monitor the data in the memory 150 through the UART output module 120a. In some embodiments, the UART output module 120a is an output module that is idle during the detection operation.

In some embodiments, the IC 10a includes more memory, such as memory 160. Similarly, according to the control signal Ctrl3 from the controller 110, the DMA device 140 is configured to access the memory 160 in response to the trigger signal Trig, so as to obtain the data DAT1. Thus, after obtaining the data DAT of the memory 150 and the data DAT1 of the memory 160, the DMA device 140 is configured to sequentially transmit the data DAT and the data DAT1 to the UART output module 120a. Next, according to the control signal Ctrl2 from the controller 110, the UART output module 120a is configured to transmit the data DAT and the data DAT1 to the converter 30a through the pin 31 according to the UART communication protocol. In some embodiments, the transmission sequence of the data DAT and DAT1 is determined by the control signal Ctrl2.

In the IC 10a, when the DMA device 140 transmits the data DAT to the outside, the processor 170 is configured to control the operation of the functional circuit 180 without participating in the transmission of the data DAT. In some embodiments, the data in the memory 150 is stored by the processor 170. In some embodiments, the processor 170 stores the data DD of the functional circuit 180 in the memory 150, and the data DD may be debugging data or calculation data generated during operation. In addition, compared with the controller 110, the processor 170 is not coupled to the pins 21 and 22. In some embodiments, the processor 170 is configured to store the data DD of other circuits (not shown) or operating in the memory 150.

Figure 2:
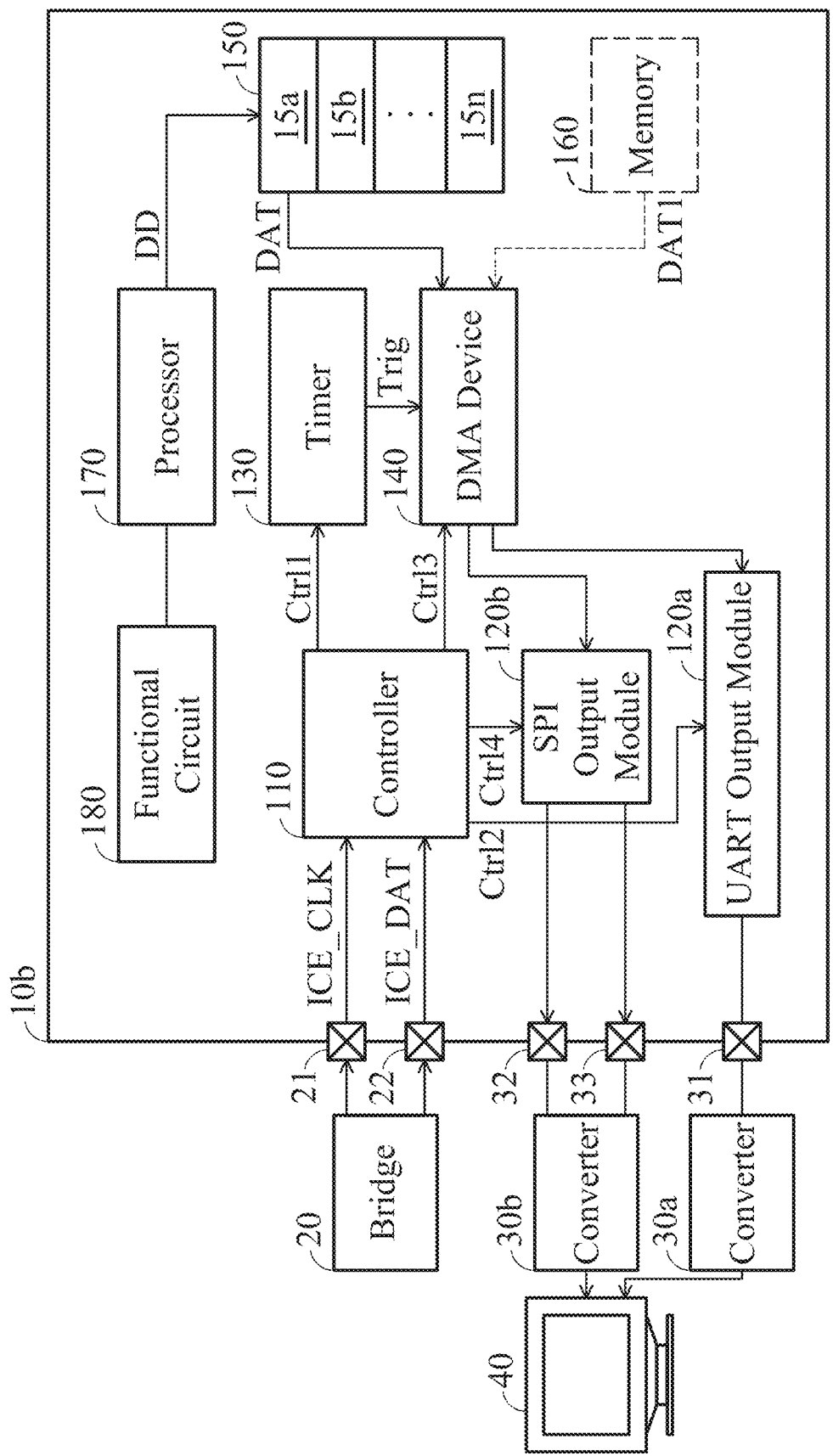
FIG. 2 shows a monitoring system of the memory content according to some embodiments of the invention.

FIG. 2 shows a monitoring system 100B of the memory content according to some embodiments of the invention. The monitoring system 100B includes the IC 10b, the bridge 20, the converters 30a and 30b, and a display 40. In some embodiments, the IC 10b is a chip under test which is disposed on the PCB and has a plurality of pins. The IC 10b includes a controller 110, a UART output module 120a, a timer 130, a DMA device 140, a memory 150, an output module 120b, a processor 170, and a functional circuit 180. Similarly, the controller 110 is coupled to the bridge 20 through the pin 21 and the pin 22. The controller 110 is coupled to the UART output module 120a, the timer 130, the DMA device 140 and the output module 120b. According to the command ICE_DAT from the bridge 20, the controller 110 is configured to provide the control signals Ctrl1, Ctrl2, Ctrl3, and Ctrl4 to the timer 130, the UART output module 120a, the DMA device 140, and the output module 120b, respectively. In this embodiment, the output module 120b is a serial peripheral bus (SPI), hereinafter referred to as the SPI output module 120b. The SPI output module 120b is coupled to the converter 30b through the pins 32 and 33. In this embodiment, the converter 30b is a USB-to-SPI connector, which is used to convert the SPI signals from the pins 32 and 33 into the USB signal, and to transmit the USB signal to the display 40. In some embodiments, the display 40 may be a processing device such as a personal computer, a tablet, or a mobile phone.

In FIG. 2, according to the control signal Ctrl1 from the controller 110, the timer 130 is configured to periodically provide a trigger signal Trig to the DMA device 140. In addition, according to the control signal Ctrl3 from the controller 110, the DMA device 140 is configured to set the transmission channel, so as to access the memory 150 in response to the trigger signal Trig to obtain the data DAT.

In some embodiments, according to the first transmission channel, after the DMA device 140 obtains the data DAT from the first block (e.g., the block 15a), the DMA device 140 transmits the data DAT from the first block to the UART output Module 120a. Next, according to the control signal Ctrl2 from the controller 110, the UART output module 120a is configured to transmit the data DAT from the first block to the converter 30a through the pin 31 according to the UART communication protocol. Moreover, according to the second transmission channel, after the DMA device 140 obtains the data DAT from the second block (e.g., the block 15b), the DMA device 140 transmits the data DAT from the second block to the SPI output module 120b. Next, according to the control signal Ctrl4 from the controller 110, the SPI output module 120b is configured to transmit the data DAT from the second block to the converter 30b through the pins 32 and 33 according to the SPI communication protocol. The UART output module 120a is configured to set the transmission rate of the data DAT from the first block according to the control signal Ctrl2. Furthermore, the SPI output module 120b is configured to set the transmission rate of the data DAT from the second block according to the control signal Ctrl4. Thus, the data DAT from different blocks are respectively transferred to the display 40 through the converters 30a and 30b for the user to monitor in real time. In some embodiments, the user can simultaneously use the bridge 20 to detect the IC 10b and use the UART output module 120a and the SPI output module 120b to immediately monitor the data of different blocks in the memory 150. In some embodiments, the UART output module 120a and the SPI output module 120b are output modules that are idle during the detection operation.

In some embodiments, the IC 10b includes more memories, such as the memory 160. Similarly, according to the control signal Ctrl3 from the controller 110, the DMA device 140 is configured to access the memory 160 in response to the trigger signal Trig, so as to obtain the data DAT1. Thus, according to the third transmission channel and the fourth transmission channel, after obtaining the data DAT of the memory 150 and the data DAT1 of the memory 160, the DMA device 140 is configured to transmit the data DAT and the data DAT1 to the UART output module 120a and the SPI output module 120b, respectively. Next, according to the control signal Ctrl2 from the controller 110, the UART output module 120a is configured to sequentially transmit the data DAT to the converter 30a through the pin 31 according to the UART communication protocol. Moreover, according to the control signal Ctrl4 from the controller 110, the SPI output module 120b is configured to sequentially transmit the data DAT1 to the converter 30b through the pins 32 and 33 according to the SPI communication protocol. Thus, the data DAT and DAT1 from different memories are respectively transferred to the display 40 through the converters 30a and 30b for the user to monitor in real time. In some embodiments, the user can simultaneously use the bridge 20 to detect the IC 10b and use the UART output module 120a and the SPI output module 120b to monitor the data of different memories in real time.

In the embodiments of the invention, the UART output module 120a and the SPI output module 120b are output modules using different communication protocols. In some embodiments, the output module 120a and the output module 120b may be output modules using the same communication protocol. In some embodiments, the output module 120a and the output module 120b may use the same transmission rate. In some embodiments, the output module 120a and the output module 120b may use different transmission rates. In addition, each output module is coupled to the corresponding converter by using corresponding pins according to actual applications. In some embodiments, the output module 120a and/or the output module 120b may be a UART output module, an SPI output module, an inter-integrated circuit (I2C) output module, a general-purpose input and output (GPIO) output module and so on. In some embodiments, the display 40 is configured to directly receive the data from the output module 120a and/or the output module 120b, so the converter 30a and/or 30b can be omitted.

Figure 3:
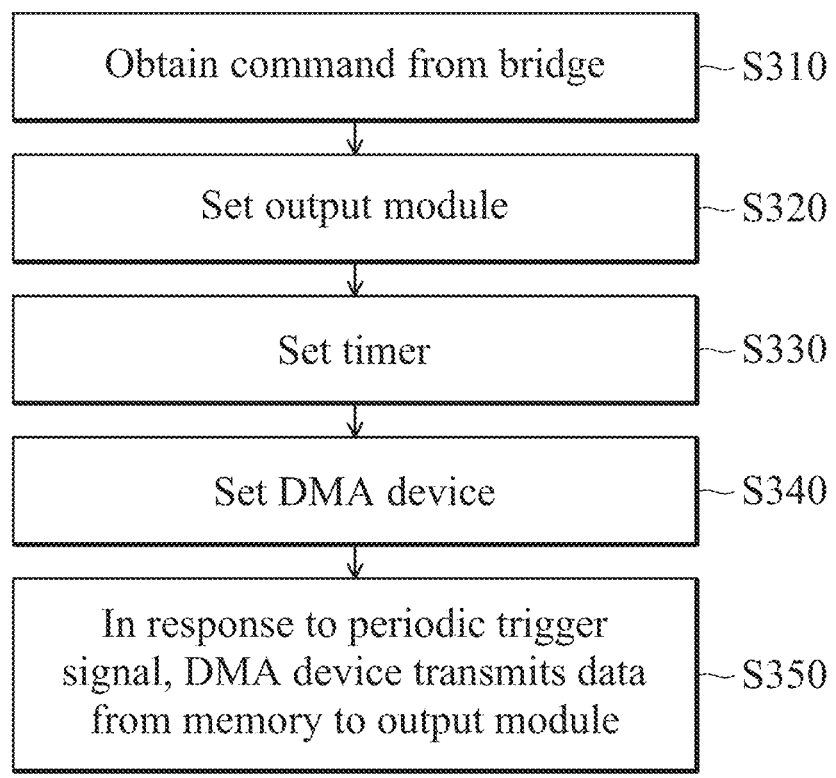
FIG. 3 shows a monitoring method according to some embodiments of the invention for real-time monitoring of the memory in an IC.

FIG. 3 shows a monitoring method according to some embodiments of the invention for real-time monitoring of the memory (e.g., the memory 150 and/or the memory 160) in an IC (e.g., the IC 10a and/or the IC 10b). First, in step S310, when the bridge (e.g., the bridge 20) is connected to the IC, a command from the bridge (e.g., the command ICE_DAT) is obtained. Next, in step S320, the related output modules (e.g., the output modules 120a and/or 120b) are set according to the command of the bridge, for example, the transmission rate is set according to the corresponding communication protocol. Next, in step S330, according to the command from the bridge, a timer (e.g., the timer 130) is used to set the time or period for providing the trigger signal Trig. Next, in step S340, according to the command from the bridge, the transmission task of the DMA device (e.g., the DMA device 140) and the corresponding transmission channel are set, so as to move data between the memory and the output module. Next, in step S350, in response to the periodic trigger signal Trig, the DMA device is configured to transmit data from the designated block or designated memory to the corresponding output module according to the transmission channel, so as to provide the data of the memory to the external electronic device (e.g., the display 40), thereby allowing the user to monitor the memory in real time. In some embodiments, the DMA device is configured to transfer the contents of different blocks of memory to the same or different output modules. Moreover, the DMA device is configured to transfer the contents of different memories to the same or different output modules.

According to the embodiments of the invention, the data in the memory can be moved to the designated output module by using the DMA device without affecting the normal operation of the IC processor and without occupying the bridge, so as to monitor or debug the memory in real time through an external electronic device (e.g., the display 40).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC), comprising:
at least one input pin;

a controller coupled to the input pin and configured to provide a first control signal in response to a command from the input pin;
a timer configured to periodically provide a trigger signal according to the first control signal corresponding to the command from the input pin;
a first memory;
a processor coupled to the first memory and configured to store first data in the first memory;
at least one output pin;
an output module coupled to the output pin; and
a direct memory access (DMA) device coupled between the output module and the first memory, and configured to obtain the first data from the first memory in response to the trigger signal, and transmit the first data to the output module,
wherein the output module is configured to provide the first data to the output pin according to a transmission rate.

2. The IC as claimed in claim 1, wherein the timer is implemented in the controller.

3. The IC as claimed in claim 1, wherein the controller is further configured to provide a second control signal to the output module to set the transmission rate, and the controller is further configured to provide a third control signal to the DMA device, wherein the DMA device is configured to obtain the first data from a specific block of the first memory according to the third control signal.

4. The IC as claimed in claim 1, further comprising:
a second memory,
wherein the DMA device is further configured to obtain a second data from the second memory in response to the trigger signal, and transmit the second data to the output module,
wherein the output module is configured to provide the second data to the output pin according to the transmission rate.

5. The IC as claimed in claim 4, wherein the controller is further configured to provide a third control signal to the DMA device, and the DMA device is configured to respectively obtain the first data from the first memory and the second data from the second memory according to the third control signal.

6. The IC as claimed in claim 4, wherein the output module is configured to provide the first data to the output pin using a UART, SPI or I2C communication protocol.

7. The IC as claimed in claim 1, wherein the output module is a general-purpose input and output module.

8. A monitoring system, comprising:
a bridge; and
an integrated circuit (IC), comprising:
at least one input pin coupled to the bridge, and configured to receive a command from the bridge;
a controller directly coupled to the input pin, and configured to provide a first control signal in response to the command;
a timer configured to periodically provide a trigger signal according to the first control signal corresponding to the command from the bridge;
a first memory;
a plurality of first output pins;
a first output module coupled to the plurality of first output pins; and
a direct memory access (DMA) device coupled to the first output module and the first memory, and configured to obtain first data from the first memory in response to the trigger signal, and transmit the first data to the first output module,
wherein the first output module is configured to provide the first data to the plurality of first output pins according to a first transmission rate.

9. The monitoring system as claimed in claim 8, wherein the controller is further configured to respectively provide a second control signal and a third control signal to the first output module to set the first transmission rate.

10. The monitoring system as claimed in claim 8, wherein the timer is implemented in the controller.

11. The monitoring system as claimed in claim 8, wherein the first output module is configured to provide the first data to the first output pins using a UART, SPI or I2C communication protocol.

12. The monitoring system as claimed in claim 8, wherein the IC further comprises:
at least one second output pin; and
a second output module coupled to the second output pin,
wherein the DMA device is further configured to obtain second data from the first memory in response to the trigger signal, and transmit the second data to the second output module,
wherein the second output module is configured to provide the second data to the second output pin according to a second transmission rate.

13. The monitoring system as claimed in claim 12, wherein the first output module and the second output module provide the first data and the second data using different communication protocols.

14. The monitoring system as claimed in claim 12, wherein the first transmission rate is different from the second transmission rate.

15. The monitoring system as claimed in claim 12, wherein the controller is further configured to provide a fourth control signal to the DMA device, and the DMA device is configured to obtain the first data and the second data from different blocks of the first memory according to the fourth control signal.

16. A monitoring method for a first memory of an integrated circuit (IC), comprising:
obtaining a command from a bridge, by a controller of the IC, when the bridge is connected to the IC;
setting a first transmission rate of a first output module of the IC according to the command;
setting a timer of the IC, by the controller, in response to the command from the bridge, so as to periodically provide a trigger signal;
obtaining first data from the first memory through a direct memory access (DMA) device of the IC in response to the trigger signal; and
providing the first data to the outside of the IC through the first output module according to the first transmission rate.

17. The monitoring method as claimed in claim 16, wherein the IC is coupled to an electronic device through a converter, and the first output module is configured to provide the first data to the electronic device through the converter.

18. The monitoring method as claimed in claim 16, wherein obtaining first data from the first memory through the DMA device of the IC in response to the trigger signal further comprises:
obtaining the first data from a specific block of the first memory through the DMA device according to the command.

19. The monitoring method as claimed in claim 16, further comprising:
- obtaining second data from a second memory through the DMA device of the IC in response to the trigger signal; and
- providing the second data to the outside of the IC according to the first transmission rate.

20. The monitoring method as claimed in claim 16, further comprising:
- setting a second transmission rate of a second output module of the IC according to the command;
- obtaining second data from a second memory through the DMA device of the IC in response to the trigger signal; and
- providing the second data to the outside of the IC through the second output module according to the second transmission rate.

\* \* \* \* \*